United States Patent [19]
Enomoto

[11] Patent Number: 5,277,497
[45] Date of Patent: Jan. 11, 1994

[54] VOLTAGE TO PULSE-WIDTH CONVERSION CIRCUIT

[75] Inventor: Hiroshi Enomoto, Tokyo, Japan

[73] Assignee: Oki Electric Industry Co., Ltd., Tokyo, Japan

[21] Appl. No.: 837,154

[22] Filed: Feb. 19, 1992

[30] Foreign Application Priority Data

Mar. 4, 1991 [JP] Japan ................ 3-037531

[51] Int. Cl.⁵ ............................ H03K 21/08
[52] U.S. Cl. ......................... 377/114; 377/42; 307/265; 315/291; 315/DIG. 4
[58] Field of Search .......... 377/114, 113, 42; 328/58, 74, 111; 307/265, , 266, 267; 315/291, DIG. 4; 340/767

[56] References Cited

U.S. PATENT DOCUMENTS

| | | | |
|---|---|---|---|
| 4,241,295 | 12/1980 | Williams, Jr. | 315/291 |
| 4,370,067 | 1/1983 | Iwakura et al. | 307/265 |
| 4,700,367 | 10/1987 | Kawazoe et al. | 377/114 |
| 4,891,828 | 1/1990 | Kawazoe | 377/114 |
| 5,073,733 | 12/1991 | Tanno et al. | 377/42 |
| 5,113,086 | 5/1992 | Cho | 377/43 |

*Primary Examiner*—William L. Sikes
*Assistant Examiner*—Scott A. Ouellette
*Attorney, Agent, or Firm*—Spencer, Frank & Schneider

[57] ABSTRACT

A voltage to pulse-width conversion circuit includes a logarithmic clock generator for receiving a reference frequency signal and generating a logarithmic clock signal TCK; a counter for counting the number of clock pulses of the logarithmic clock signal TCK and outputting a digital value having a plurality of bits; a digital to analog converter for converting the digital value into an analog signal; and a voltage comparator for comparing the output signal of the digital to analog converter with a pulse width modulated control voltage and generating a pulse width modulated output signal with a predetermined duty ratio.

20 Claims, 7 Drawing Sheets

VOLTAGE TO PULSE-WIDTH CONVERSION CIRCUIT

REFERENCE TO RELATED APPLICATION

This application claims the right of priority under 35 U.S.C. 119 of Japanese Patent Application Ser. No. 03-037531, filed on Mar. 4, 1991, the entire disclosure of which is incorporated herein by reference.

BACKGROUND OF THE INVENTION

1. Field of the Invention

The present invention relates to a voltage to pulse-width conversion circuit, and in particular to a voltage to pulse-width conversion circuit for adjusting the brightness of an electronic display device.

2. Description of the Related Art

Recently, many people enjoy themselves by listening to music programs with audio systems installed for example on the dashboards of their cars. Some of the audio systems have display systems which change displayed information in accordance with the mode selection between cassette mode and the radio mode so as to improve the operability of the audio system. In other words, when a listener listens to a music on cassette tape, the display system displays information with respect to the cassette tape. On the other hand, when the listener listens to a radio program, the display system displays information with respect to the radio program for example mode indication of FM/AM, and frequency of the radio program.

However, the information displayed on the display panel should be clearly viewed in any driving situation, regardless of whether it is daytime or nighttime. To satisfy this requirement, many display panels are provided with, for example, a fluorescent display tube or the like for displaying the information. In addition, they are also provided with a brightness adjustment function for adjusting the brightness of the display in accordance with the surrounding brightness. When the driver listens to a music program while driving the car for a long time from the daytime to the nighttime, if the brightness of the display panel cannot be adjusted, he or she will suffer from eye fatigue which could result in a serious accident. Thus, the brightness adjustment function of the electronic display device, for example a fluorescent display tube installed in the car, is very important.

Related to the brightness adjustment function for adjusting the brightness of the electronic display device to a desired level, a method for controlling the pulse width of a drive signal applied to each segment of a display element of a fluorescent display device and setting the brightness by means of a duty ratio is known. In this pulse width control method, a voltage to pulse-width conversion circuit for converting the pulse width of a brightness control voltage into a predetermined pulse width is used. Many types of conversion circuits have been proposed.

For example, the patent specification of U.S. Pat. No. 4,891,828 discloses the above mentioned voltage to pulse-width conversion circuit. This voltage to pulse-width conversion circuit outputs a pulse width modulated output signal (or a PWM output signal) having a duty ratio set by the operator in the electronic display device and the duty cycle adjusts the brightness of the display device. In other words, this voltage to pulse-width conversion circuit compares a signal S3, where the number of pulses of a reference frequency S2 is counted and then converted into an analog signal, with a PWM control voltage S1, whose amplitude is controlled by the operator, and outputs the resultant signal as a PWM output signal Va.

FIG. 7 shows waveforms of signals representing the relationship among the PWM control voltage S1, the reference frequency S2, the analog signal S3 being converted, and the PWM output signal Va. The signal S3 has stair step voltage values which vary in accordance with the counted values of the reference frequency S2 and which are repeated at predetermined periods. For example, an eight-bit binary counter divides the frequency of the reference frequency signal S2. The output signal with eight bits is input to a D/A converter and then output as the signal S3.

When $S1 \geq S3$, the PWM output signal Va goes high. When $S1 \leq S3$ takes, the signal VA goes low. Thus, when a PWM control voltage S1-1 is applied, the voltage to pulse-width conversion circuit outputs a PWM output signal Va-1 as the PWM output signal Va. When a PWM control voltage S1-2 is applied, the circuit outputs a PWM output signal Va-2 as the PWM output signal Va. Consequently, as shown in FIG. 8, the period t during which the D/A converter outputs a predetermined voltage is equal to one period of the reference frequency signal S2. Namely, the period t is constant for all output states of the D/A converter. Thus, the PWM output signal Va varies in steps of period t regardless of the duty ratio of the PWM output signal Va.

Thus, as shown by symbol Q of FIG. 8, when the PWM control voltage S1 becomes equal to the output voltage S3 of the D/A converter, one of the PWM output signals Va-1 and Va-2 shown in the figure is output as the PWM output signal Va in accordance with a delicate variation of the PWM control voltage S1. Thus, the PWM output signal Va becomes unstable. In particular, when the duty ratio is set to a low value for example 1 to 25%, the instability of this signal becomes significant. In other words, when the PWM control voltage S1 as shown in FIG. 8 is input, since the duty ratio of the waveform Va-1 becomes 1.56% (4/256) and that of the waveform Va-2 becomes 1.95% (5/256), the degree of variation of the duty ratio of the waveform Va-2 against the waveform Va-1 becomes 20%.

Thus, when the voltage to pulse-width conversion circuit in accordance with the related art is used as a control circuit of an electronic display device installed in a car where the noise level is high, noise is superimposed on the PWM control voltage S1 and thereby the voltage S1 delicately fluctuates in the vicinity of the voltage level of the symbol Q. Consequently, the PWM output signal Va varies between the waveforms Va-1 and Va-2. Since the degree of variation of the duty ratio is as high as 20%, when the fluorescent display tube or the like is driven with the PWM output signal Va, a large difference takes place between the brightness of which the tube is driven with the PWM output signal Va having the waveform Va-1 and that driven with the PWM output signal Va having the waveform Va-2. Thus, the difference of brightness becomes a visible flickering. Such a flickering phenomenon is a cause of remarkable degradation of the quality of the display devices of car audio systems.

To prevent such a flickering phenomenon, for example, a method for shortening the variation steps (period t) of the PWM output signal Va is known. To suppress the flickering phenomenon of for example a fluorescent display tube, the degree of variation of the PWM output signal Va should be limited to 10% of the duty ratio. To accomplish this limitation, it is essential to shorten the period t by raising the frequency of the reference frequency signal S2 so as to increase the number of bits of the above mentioned binary counter.

However, when the number of bits of the counter is increased, a D/A converter with the same number of bits should be used. Conventional D/A converters comprise a decoder, analog switches, and voltage dividing resistors whose numbers are the same as the number of outputs of the decoder. When the number of bits of the counter is increased, the numbers of the analog switches and the voltage dividing resistors should be increased.

Thus, when such a voltage to pulse-width conversion circuit is accomplished in an integrated circuit, the size of the chip becomes large thereby raising the cost. In addition, when the duty ratio becomes large, the variation steps of the PWM output signal Va become small. Consequently, when the voltage of the signal S1 is adjusted with a variable resistor, the brightness does not vary unless the variable resistor is largely adjusted.

SUMMARY OF THE INVENTION an object of the present invention is to solve problems of the related art and to provide a voltage to pulse-width conversion circuit for obtaining a high quality display device.

A voltage to pulse-width conversion circuit comprises a logarithmic clock generator for receiving a reference frequency signal, dividing the frequency of the signal by a plurality of integers to produce ratio frequency signals, logarithmically converting the ratio frequency signals, and generating a logarithmic clock signal, a counter for receiving the logarithmic clock signal from the logarithmic clock generator, counting clock pulses of the logarithmic clock signal, and outputting a digital value having a plurality of bits, a digital to analog converter for converting a digital value from the counter into an analog signal, and a voltage comparator for comparing an output of the digital to analog converter with a pulse width conversion control voltage and outputting a pulse width modulated output signal with a predetermined duty ratio.

An electronic apparatus with brightness control function for adjusting brightness thereof to a desired level, comprises an input circuit for inputting a predetermined pulse width modulation control voltage, an oscillation circuit for generating a reference frequency, a logarithmic clock generator for inputting the reference frequency signal, dividing the frequency of the signal by a plurality of integers to produce ratio frequency signals, logarithmically converting the ratio frequency signals and generating a logarithmic clock signal, a counter for receiving the logarithmic clock signal from the logarithmic clock generator, counting the number of pulses of the signal, and outputting a digital value having a plurality of bits, a digital to analog converter for converting the digital value from the counter into an analog signal, and a voltage comparator for comparing an output of the digital to analog converter with the pulse width modulated control voltage, outputting a pulse width modulated output signal with a predetermined duty ratio, and adjusting the brightness in accordance with the output signal.

Since the voltage to pulse-width conversion circuit according to the present invention has the above mentioned construction, the logarithmic clock generator generates the logarithmic clock signal by means of the reference frequency signal; the counter counts the number of pulses of the logarithmic clock signal, and supplies the counted value to the D/A converter; and the D/A converter converts the counted value into the analog signal. Since the logarithmic clock signal is supplied to the D/A converter, when the output voltage of the analog signal is in a lower level, the time for holding a predetermined analog voltage is short; and when the output voltage of the analog signal is in a higher level, the holding time is long. When the voltage comparator compares the level of the analog signal with that of the PWM control signal, if the duty ratio of the PWM output signal as the comparison result is low, the degree of variation is small; and if the duty ratio is high, the degree of variation is large. Thus, without necessity of increasing the circuit size of the D/A converter, the flickering phenomenon can be suppressed. In addition, even if the duty ratio is high, the brightness can be readily adjusted. Therefore, the above problems can be solved.

Further applications of the present invention will become apparent from the detailed description and specific examples, while indication of preferred embodiments of the invention, are given by way of illustration only, since various changes and modifications within the spirit and scope of the invention will become apparent to those skilled in the art from this detailed description.

BRIEF DESCRIPTION OF DRAWINGS

These and other features and advantages of the invention may be more completely understood from the following detailed description of the preferred embodiments of the invention with reference to the accompanying drawings in which.

DESCRIPTION OF PREFERRED EMBODIMENT

With reference to the accompanying drawings, an embodiment of a voltage to pulse-width conversion circuit in accordance with the present invention is described in detail.

Figure 1:
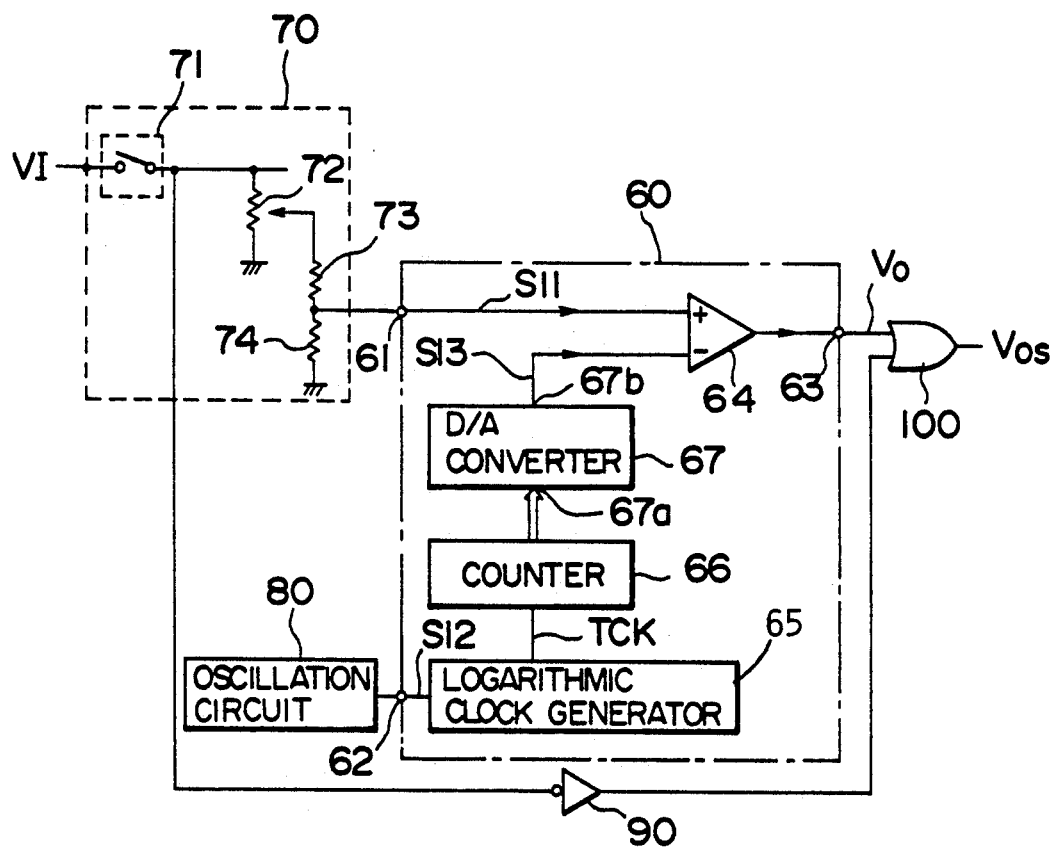
FIG. 1 is a block diagram showing an embodiment of a voltage to pulse-width conversion circuit in accordance with the present invention.

FIG. 1 is a functional block diagram showing an embodiment of a voltage to pulse-width conversion circuit in accordance with the present invention. The voltage to pulse-width conversion circuit 60 in accordance with the embodiment outputs a PWM output signal Vo for adjusting the brightness of an electronic display device installed in a car or the like in accordance with the setting performed by the operator. The conversion circuit 60 is connected to an input circuit 70 which outputs a predetermined PWM control voltage S11 for controlling the voltage to pulse-width conversion in accordance with the operation performed by the operator and an oscillation circuit 80 which generates a reference frequency signal S12.

The voltage to pulse-width conversion circuit 60 comprises a voltage comparator 64, a logarithmic clock generator 65, a counter 66, and a D/A converter 67. The conversion circuit 60 is also provided with an input terminal 61 for inputting the PWM control voltage S11, an input terminal 62 for inputting the reference frequency signal S12, and an output terminal 63 for outputting the PWM output signal Vo whose frequency is for example 128 Hz.

The input terminal 61 is connected to a (+) input of the voltage comparator 64. An output of the voltage comparator 64 is connected to the output terminal 63. The input terminal 62 is connected through the logarithmic clock generator 65 to an input of the counter 66 which is constructed of an eight-bit binary counter. An output of the counter 66 is connected to an input terminal 67a of the D/A converter 67 having for example six bits.

The D/A converter 67 receives an output signal of the counter 66 at the input terminal 67a, converts the signal into an analog signal, and then outputs this signal from an output terminal 67b which is connected to a (−) input of the voltage comparator 64. In addition, the input terminal 61 is connected to the input circuit 70 which supplies the PWM control voltage S11 which varies in accordance with the setting designated by the operator. The input circuit 70 has a switch 71 for lighting up for example instruments on the dashboard of the car. One end of the switch 71 is connected to a (+) battery voltage VI (normally, around 13.8 V). The other end of the switch 71 is grounded through a variable resister 72 which adjusts the brightness of a fluorescent display tube. The connection point of voltage dividing resisters 73 and 74 is connected to the input terminal 61. The resistance values of the voltage dividing resistors are determined in accordance with both the operating input voltage range of the voltage comparator 64 and the output range of the D/A converter 67.

The input terminal 62 is also connected to the oscillation circuit 80 which supplies the reference frequency signal S12 having for example a frequency of 131 kHz. The other end of the nighttime light-up switch 71 is connected to a detection circuit 90 which detects the off state of the switch 71 and outputs a signal in "H" level. Both an output of the detection circuit 90 and the output terminal 63 are connected to inputs of a two-input OR gate 100. The PWM final output signal Vos is output from an output of the two-input OR gate 100.

Figure 2:
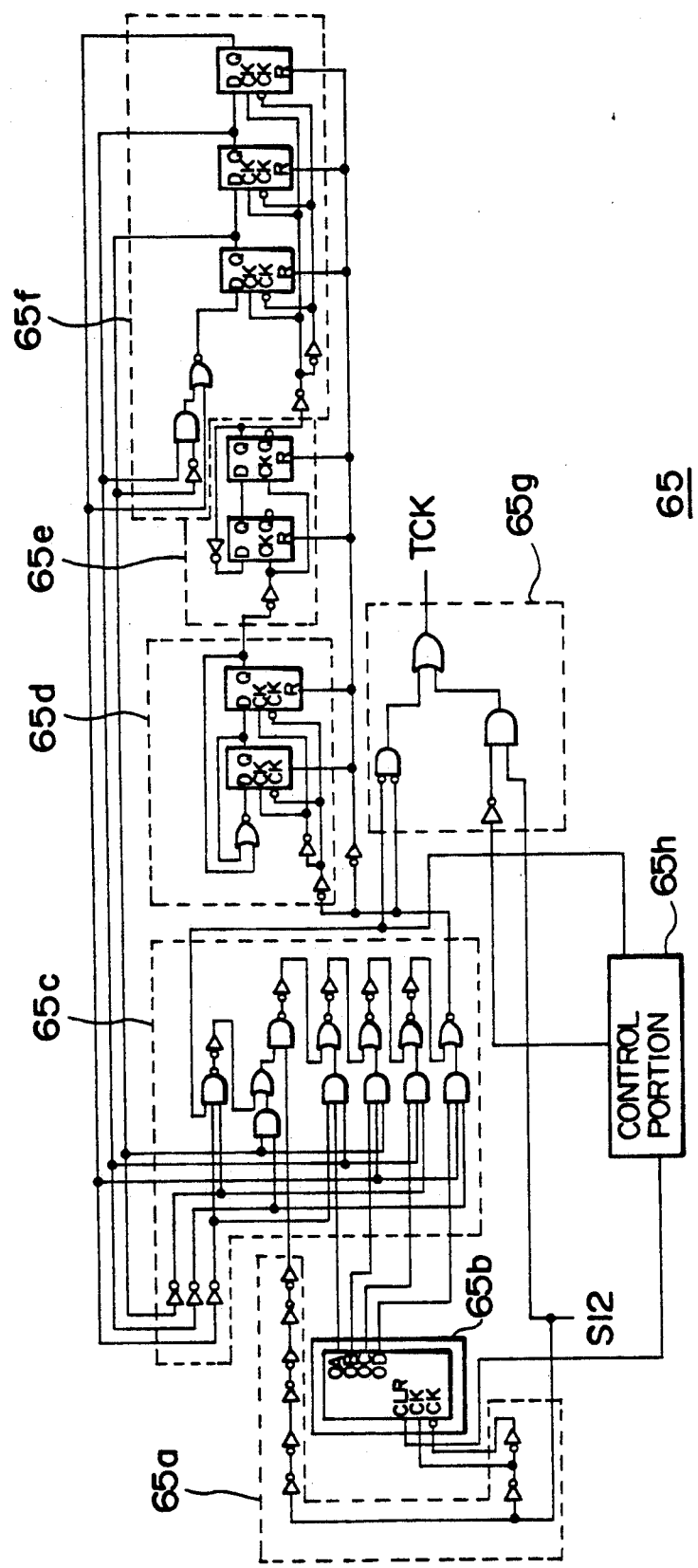
FIG. 2 is a circuit diagram showing a logarithmic clock generator of FIG. 1.

FIG. 2 is a circuit diagram showing a construction of the logarithmic clock generator 65 of FIG. 1. The logarithmic clock generator 65 comprises an input portion 65a which inputs the reference frequency signal S12 and delays the signal for a predetermined time; and a four-bit binary counter 65b connected to the output of the input portion 65a. Outputs of the input portion 65a and the counter 65b are connected to a clock selection portion 65c. The counter 65b divides the frequency of the reference frequency signal S12 by 2, 4, 8, and 16. A clock selection portion 65c selects one of outputs of the counter 65b.

Outputs of the clock selection portion 65c are connected to a ½ frequency dividing circuit 65d, a ¼ frequency dividing circuit 65e, and a 1/6 frequency dividing circuit 65f in series. Outputs of the 1/6 frequency dividing circuit 65f are fed back to the clock selection portion 65c. The ½ frequency dividing circuit 65d and the ¼ frequency dividing circuit 65e have a function which sets the number of clock pulses which are output from the counter selected by the clock selection portion 65c to 12 clock pulses. The outputs of the clock selection portions 65c are also connected to an output portion 65g which outputs the logarithmic clock signal TCK. The output portion 65g, the counter 65b, and the clock selection portion 65c are connected to a control portion 65h which controls the whole pulse-width conversion circuit.

The input portion 65a is constructed of a plurality of inverters. The clock selection portion 65c is constructed of gate circuits including AND gates, OR gates, NAND gates, NOR gates, and inverters. The ½ frequency dividing circuit 65d, the ¼ frequency dividing circuit 65e, and the 1/6 frequency dividing circuit 65f are constructed of delay type flop-flops and gate circuits. Likewise, the output portion 65g and the control portion 65h are constructed of gate circuits or the like.

Figure 3:
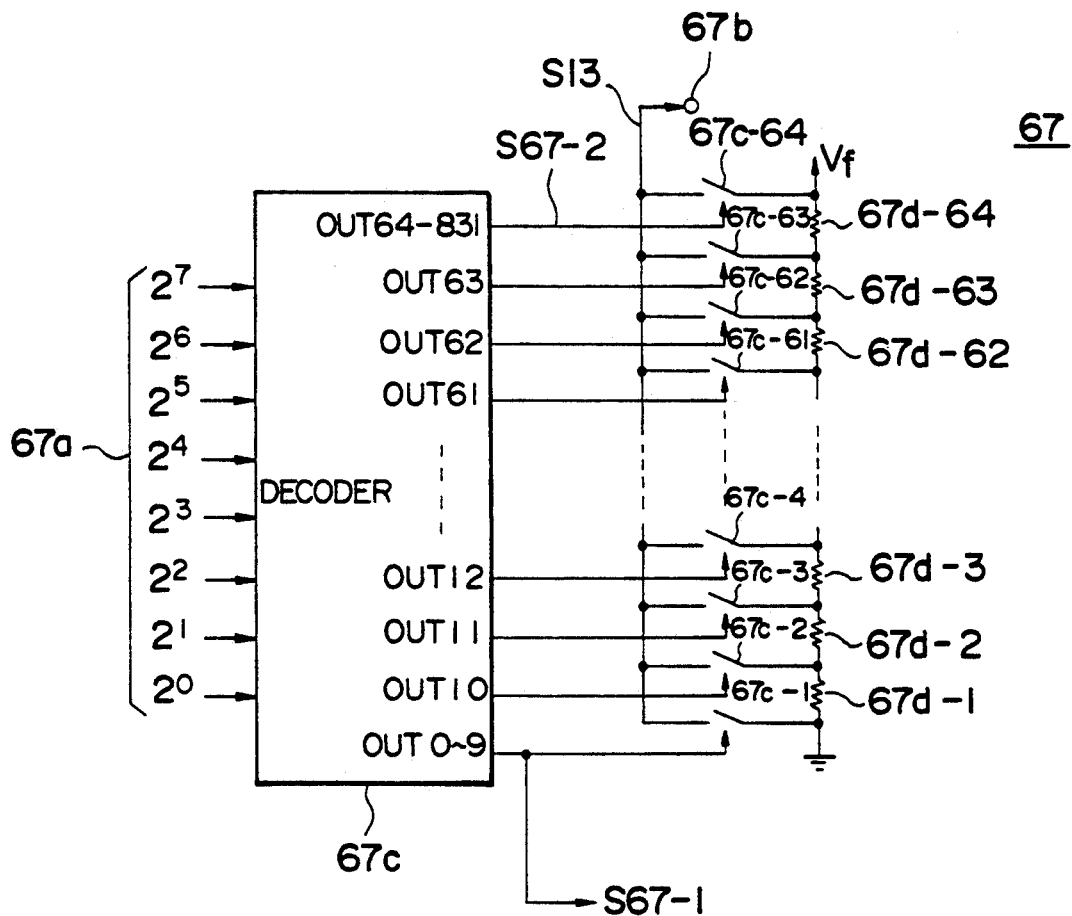
FIG. 3 is a circuit diagram showing a D/A converter of FIG. 1.

FIG. 3 is a circuit diagram showing a construction of the D/A converter 67 of FIG. 1.

The D/A converter 67 is of a resistor voltage dividing type. The D/A converter 67 is provided with a decoder 67c, analog switches 67c-1 to 67c-64, and voltage dividing resisters 67d-1 to 67d-64. The decoder 67c is provided with input terminals 67a having eight-bit inputs $2^0$ to $2^7$ and output terminals OUT 0 to 9, OUT 10 to 63, and OUT 64 to 831. The decoder 67c receives a counted value of the counter 66 from the input terminal 67a, determines the counted value, and outputs the resultant data. The output terminals OUT 0 to 9, OUT 10 to 63, and OUT 64 to 831 of the decoder 67c are connected to the control terminals of the switches 67c-1 to 67c-64. One end of each of the switches 67c-1 to 67c-64 is connected commonly to the output terminal 67b.

The other end of each of the switches 67c-1 to 67c-64 is connected to each connection point of the voltage dividing resistors 67d-1 to 67d-64 which are connected in series. The other end of the switch 67c-1 and the voltage dividing resister 67d-1 are connected to the ground voltage. The other end of the switch 67c-64 and the voltage dividing resister 67d-64 are connected to the reference voltage Vf. The output terminal OUT 0 to 9 of the decoder 67c outputs a signal S67-1. The output terminal OUT 64 to 831 outputs a signal S67-2.

Figure 5:
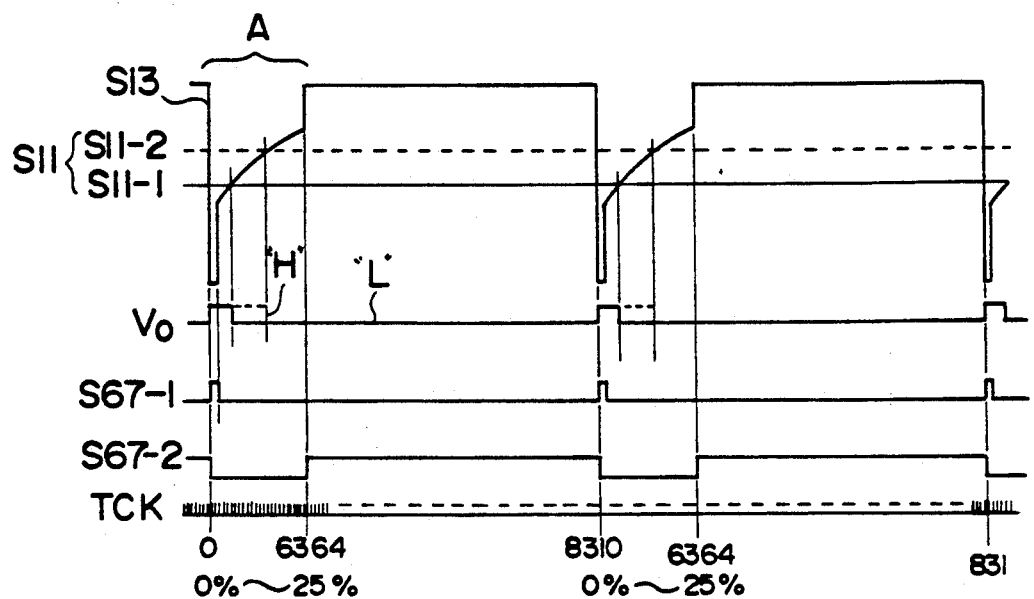
FIG. 5 is a schematic showing waveforms of signals of FIG. 1.
Figure 6:
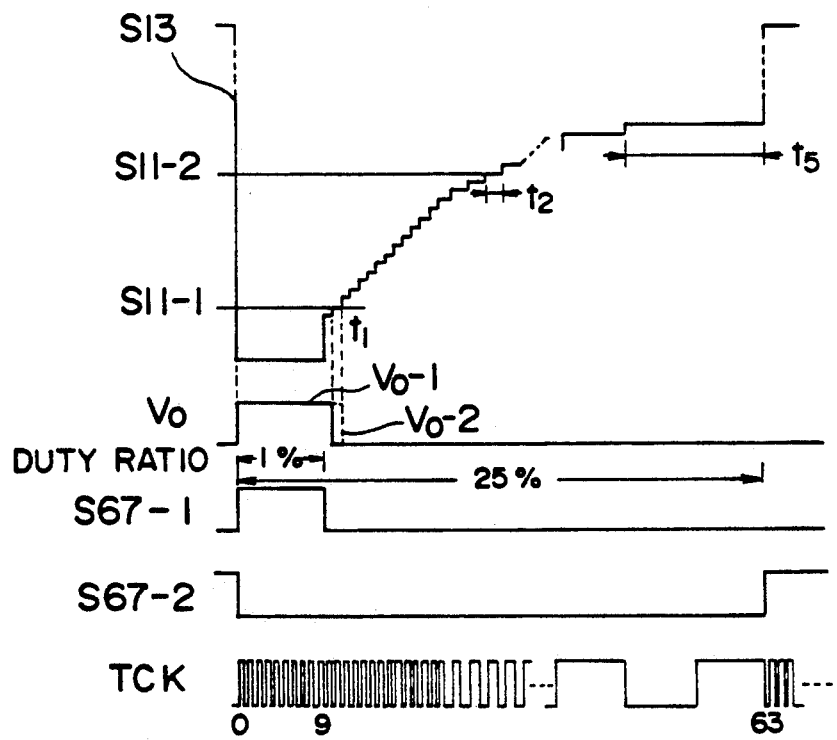
FIG. 6 is an enlarged schematic showing portion A of FIG. 5.
Figure 7:
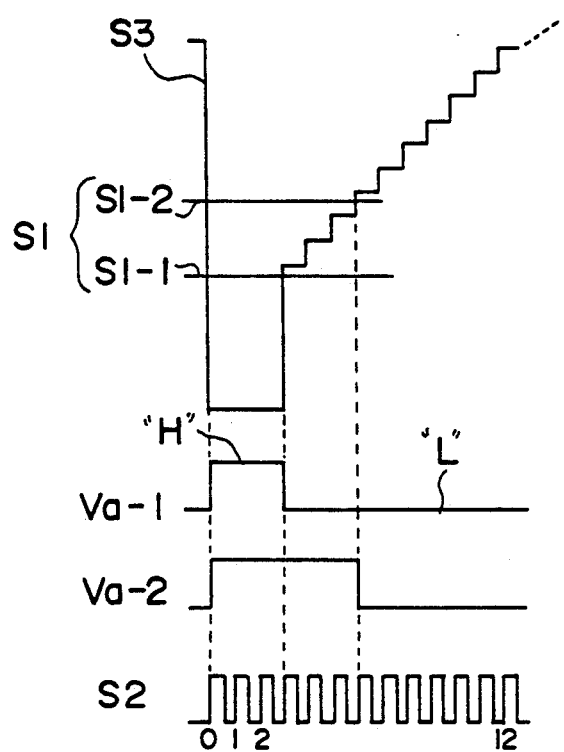
FIG. 7 is a schematic showing waveforms of signals in accordance with the prior art.
Figure 8:
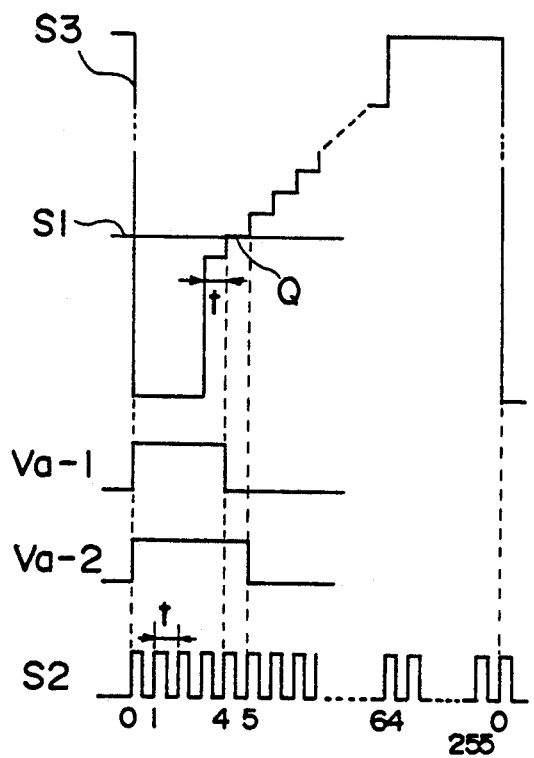
FIG. 8 is a schematic showing waveforms of signals in accordance with the prior art.

FIG. 5 is a schematic showing waveforms of signals of FIG. 1. FIG. 6 is an enlarged schematic showing portion A of FIG. 5. Operation of the embodiment of FIG. 1 is described with reference to FIGS. 2, 3, 5 and 6.

Figure 4:
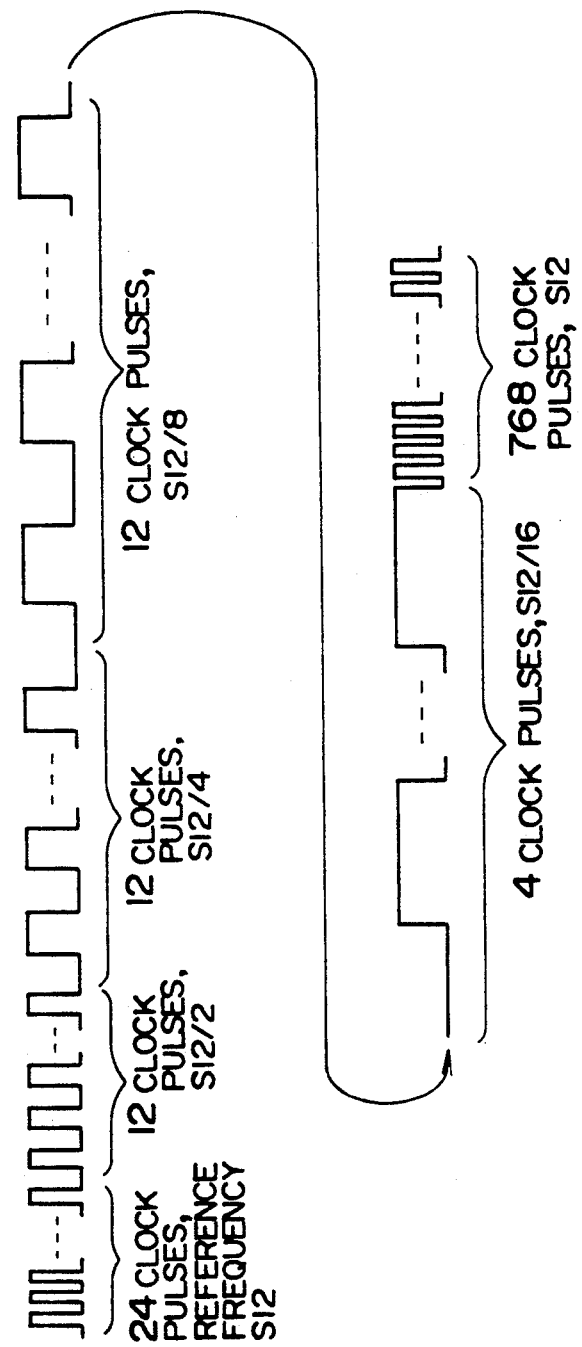
FIG. 4 is a schematic showing a waveform of a logarithmic clock signal of FIG. 1.

When an operator turns on the ignition key of the car and then turns on the power of the electronic display device, the power is supplied to the circuit shown in FIG. 1. The oscillation circuit 80 oscillates and outputs the reference frequency signal S12 having a frequency of 131 kHz to the logarithmic clock generator 65. The logarithmic clock generator 65 outputs the reference frequency signal S12 to the counter 65b through the input portion 65a. Thereafter, the frequency of the signal S12 is divided and at the first bit of the counter 65b, a signal having ½ frequency of the reference frequency signal S12 is output; at the second bit, a signal having ¼ frequency is output; at the third bit, a signal having ⅛ frequency is output; and at the fourth bit, a signal having 1/16 frequency is output. Each output signal having divided frequency is logarithmically converted by the clock selection portion 65c, the ½ frequency dividing circuit 65d, the ¼ frequency dividing circuit 65e, and the 1/6 frequency dividing circuit 65f under control of the control portion 65h. Thereafter, the output portion 65g outputs the logarithmic clock signal TCK as shown in FIG. 4. In other words, the logarithmic clock generator 65 outputs as the logarithmic clock signal TCK the reference frequency signal S12 for 24 clock pulses; the ½ frequency signal for 12 clock pulses; the ¼ frequency signal for 12 clock pulses; the ⅛ frequency signal for 12 clock pulses; the 1/16 frequency signal for 4 clock pulses; and the reference frequency signal S12 for 768'clock pulses.

The logarithmic clock signal TCK generated by the logarithmic clock generator 65 is supplied to the counter 66. The counter 66 successively counts counted values 0 to 831. The counted values are sent to the input terminal 67a of the D/A converter 67. The D/A converter 67 successively selects the output terminals OUT 0 to 9, OUT 10 to 63, and OUT 64 to 831 in accordance with the counted values and then successively turns on the switches 67c-1 to 67c-64 through the selected output terminals OUT 0 to 9, OUT 10 to 63, and OUT 64 to 831. Thereby, the signal S13 of the voltage which is set by the voltage dividing resistors 67d-1 to 67d-64 is output to the output terminal 67b.

Since the voltage of the signal S13 which is output from the D/A converter 67 is determined by the counted values of the logarithmic clock signal TCK counted by the counter 66, the input signal of the decoder 67c is not constant. In other words, as shown in FIG. 6, the input signal varies from periods t1 to t5, where t1 is one period of the reference frequency signal S12 and t5 is 16 periods thereof. The output signal S13 of the D/A converter 67 is supplied to the (−) input of the voltage comparator 64.

When the nighttime light-up switch 71 is turned on during nighttime car driving, the battery voltage VI of approx. 13.8 v is applied to the variable resistor 72. Thereby, a voltage in the range from 0 to 13.8 v inclusive is applied to the voltage dividing resistors 73 and 74 in accordance with the resistance of the variable resistor 72. Thus, the voltage at the connection point of the voltage dividing resistor 73 and 74 is applied to the (+) input of the voltage comparator 64 through the input terminal 61 as the PWM control voltage S11. The level of the PWM control voltage S11 varies by the adjustment of the variable resistor 72 as shown by the signals S11-1 and S11-2 of FIG. 5.

When the output signal S13 of the D/A converter 67 and the PWM control voltage S11 are input to the voltage comparator 64, the voltage comparator 64 compares the level of the signal S13 with the level of the PWM control voltages S11 (S11-1 and S11-2). Thereafter, the voltage comparator 64 generates the PWM output signal Vo in accordance with the comparison result and then outputs the signal to the output terminal 63. When S11≧S13, the PWM output signal Vo goes to a high level. When S11≦S13, the signal Vo goes to a low level. As shown in FIG. 5, by adjusting the variable resister 72, the PWM output signal Vo with a duty ratio in accordance with the PWM control voltage S11 (S11-1 and S11-2) can be obtained. The time of holding a particular voltage of the output signal S13 varies in accordance with the voltage thereof. Thus, when the voltage of the output signal S13 is low, the time for holding the particular voltage is short. In other words, when the PWM control voltage S11 is low, the degree of variation of the PWM output signal Vo is small. In contrast, when the voltage of the output signal S13 is high, the degree of variation of the PWM output signal Vo is large.

The above mentioned embodiment has the following advantages.

As shown in FIG. 6, the PWM control range in the nighttime is from 1 to 25% of the duty of the PWM output signal Vo. In addition, the variation steps of the PWM output signal Vo in the range from 1 to 25% are not constant. When the PWM output signal Vo varies around 1% of duty ratio, the variation step of the PWM output signal Vo is approx. 0.1% (1/1024) of duty ratio. Thus, the PWM control can be finely performed. In contrast, when the signal Vo varies around 25% of duty ratio, the variation step of the PWM output signal Vo is 1.6% of duty ratio (16/1024). Thus, the PWM control Vo can be coarsely performed. Consequently, even if the PWM control voltages S11 becomes the value of S11-1 shown in FIG. 6 and thereby the PWM output signal Vo repeatedly vary between the waveforms Vo-1 and Vo-2 due to effect of noise or the like, since the variation step of the PWM output signal Vo is 0.1%, the variation of brightness is not sensed by human eyes.

In addition, when the PWM output signal Vo varies around 25% of duty ratio, since the variation step of the PWM output signal Vo is 1.6%, the brightness can be readily adjusted without necessity of increasing the resistance of the variable resistor 72 of FIG. 1.

The present invention is not limited to the above embodiment described with reference to the accompanying drawings. Rather, many modifications of the present invention can be accomplished. For example, the logarithmic clock generator 65 according to the above mentioned embodiment generates the logarithmic clock signal TCK having divided frequencies and clock numbers. However, the divided frequencies and clock numbers of the logarithmic clock signal TCK are not limited to those described in the above mentioned embodiment.

An LED type display device or a red heat filament type display device can be used as the electronic display device.

In the above mentioned embodiment, the voltage to pulse-width conversion circuit according to the present invention is applied to brightness adjustment of a fluorescent display device or the like installed in a car. However, the scope of the present invention is not limited to such an application. In other words, as electronic devices have been widely used, they also become noise sources. Thus, by applying the present invention to electronic devices having a fluorescent display device with brightness adjustment function, a high quality display free of flickering can be provided. Examples of such electronic devices are home-use audio devices, home-use lighting devices, cash registers, POS terminals, and so forth with brightness adjustment function.

As described above in detail, since the voltage to pulse-width conversion circuit according to the present invention has a logarithmic clock signal generator which divides the frequency of a reference frequency signal into a plurality of frequencies and generates a logarithmic clock signal which is logarithmically converted, and supplies the logarithmic clock signal to an input of a counter, the number of circuit devices is not remarkably increased and the variation steps of the pulse width modulated output signal can be varied in accordance with duty ratio. Thus, since the size and cost of the chip for the circuit can be reduced and the pulse width can be finely controlled, when the present invention is applied to a fluorescent display tube or the like, the display quality thereof is improved.

I claim:

1. A voltage to pulse-width conversion circuit comprising:
   a logarithmic clock generator for receiving a reference frequency signal having a reference frequency, dividing the reference frequency of said signal by a plurality of integers to generate a plurality of ratio frequency signals, logarithmically converting the plurality of ratio frequency signals, and generating a logarithmic clock signal;
   a counter for receiving said logarithmic clock signal from said logarithmic clock generator, counting clock pulses of said logarithmic clock signal, and outputting a digital value having a plurality of bits;
   a digital to analog converter for converting said digital value from said counter into an analog signal; and
   a voltage comparator for comparing an output signal of said digital to analog converter with a pulse width conversion control signal and outputting a pulse width modulated output signal with a predetermined duty ratio.

2. The voltage to pulse-width conversion circuit in accordance with claim 1, wherein
   said logarithmic clock generator comprises:
   an input circuit for inputting said reference frequency signal and delaying the signal for a predetermined time to produce a delayed reference frequency signal;
   a count circuit for receiving said delayed reference frequency signal from said input circuit, dividing the reference frequency by said plurality of integers, and generating said plurality of ratio frequency signals;
   a clock selection circuit for selecting one of said plurality of ratio frequency signals of said count circuit to generate a selected output signal;
   a frequency dividing circuit for receiving said selected output signal of said clock selection circuit, generating a frequency divided output signal, and feeding back the frequency divided output signal to said clock selection circuit; and
   an output circuit for receiving said selected output signal of said clock selection circuit and outputting a logarithmic clock signal.

3. The voltage to pulse-width conversion circuit in accordance with claim 2, wherein
   said input circuit comprises a plurality of inverters.

4. The voltage to pulse-width conversion circuit in accordance with claim 2, wherein
   said count circuit comprises a four-bit binary counter and is arranged to divide the reference frequency of said delayed reference frequency signal being input by said input circuit by re integers 2, 4, 8, and 16.

5. The voltage to pulse-width conversion circuit in accordance with claim 2, wherein
   said clock selection circuit has an AND gate, an OR gate, and NAND gate, an NOR gate, and an inverter.

6. The voltage to pulse-width conversion circuit in accordance with claim 2, wherein
   said frequency dividing circuit comprises a series connection of a ⅓ frequency dividing circuit, a ¼ frequency dividing circuit, and a 1/6 frequency dividing circuit, an output of said 1/6 frequency dividing circuit being connected to an input of said clock selection circuit.

7. The voltage to pulse-width conversion circuit in accordance with claim 6, wherein
   said ⅓ frequency dividing circuit is arranged to set a number of clock pulses of the counter output selected by said clock selection circuit to 12 clock pulses.

8. The voltage to pulse-width conversion circuit in accordance with claim 7, wherein
   said ⅓ frequency dividing circuit has two delay-type flip-flops and a gate circuit.

9. The voltage to pulse-width conversion circuit in accordance with claim 6, wherein
   said ¼ frequency dividing circuit is arranged to set a number of clock pulses of the counter output selected by said clock selection circuit to 12 clock pulses.

10. The voltage to pulse-width conversion circuit in accordance with claim 9, wherein
    said 1/6 frequency dividing circuit has two delay-type flip-flops and a gate circuit.

11. The voltage to pulse-width conversion circuit in accordance with claim 6, wherein
    said 1/6 frequency dividing circuit has three delay-type flip-flops and a gate circuit.

12. The voltage to pulse-width conversion circuit in accordance with claim 2, wherein
    said logarithmic clock generator further comprises a control circuit for controlling said count circuit, said clock selection circuit, and said output circuit.

13. The voltage to pulse-width conversion circuit in accordance with claim 1, wherein
    said digital to analog converter is of a resistor voltage dividing type.

14. The voltage to pulse-width conversion circuit in accordance with claim 1, wherein
    said digital to analogy converter comprises:
    a decoder for receiving a digital value from said counter, determining an input value, and outputting a result;
    a plurality of analog switches, respectively connected to a plurality of outputs of said decoder, said plurality of analog switches being turned on and off in accordance with the result; and
    a plurality of resistors, respectively connected in series to said plurality of analog switches, for dividing the resistance thereof in accordance with on and off states of said plurality of analog switches.

15. An electronic apparatus with brightness control function for adjusting brightness to a desired level, comprising:
    an input circuit for inputting a predetermined pulse width modulation control signal;
    an oscillation circuit for generating a reference frequency signal having a reference frequency;
    a logarithmic clock generator for receiving said reference frequency signal, dividing the reference frequency of the signal by a plurality of integers to generate a plurality of ratio frequency signals, logarithmically converting the plurality of ratio frequency signals, and generating a logarithmic clock signal;

a counter for receiving said logarithmic clock signal from said logarithmic clock generator, counting a number of pulses of the logarithmic clock signal, and outputting a digital value having a plurality of bits;

a digital to analog converter for converting the digital value from said counter into an analog signal; and a voltage comparator for comparing an output signal of said digital to analog converter with said predetermined pulse width modulated control signal, outputting a pulse width modulated output signal with a predetermined duty ratio, and adjusting said brightness in accordance with the pulse width modulated output signal.

16. The electronic apparatus in accordance with claim 15, wherein said apparatus is an electronic display apparatus having a fluorescent display tube installed in a car.

17. The electronic apparatus in accordance with claim 15, wherein said apparatus is an audio apparatus having a fluorescent display tube.

18. The electronic apparatus in accordance with claim 15, wherein said apparatus is a light-up apparatus having a fluorescent display tube.

19. The electronic apparatus in accordance with claim 15, wherein said apparatus is a banking terminal equipment having a fluorescent display tube.

20. The electronic apparatus in accordance with claim 15, wherein said apparatus is a POS (or point-of-sales) terminal having a fluorescent display tube.

* * * * *